United States Patent [19]
Johnson

[11] Patent Number: 5,120,485
[45] Date of Patent: * Jun. 9, 1992

[54] METHOD OF FORMING GLAZED ENCLOSURE

[76] Inventor: Terry S. Johnson, 2943 S. Scranton St., Aurora, Colo. 80014

[*] Notice: The portion of the term of this patent subsequent to Feb. 16, 2005 has been disclaimed.

[21] Appl. No.: 501,261

[22] Filed: Mar. 28, 1990

Related U.S. Application Data

[60] Continuation of Ser. No. 406,874, Sep. 11, 1989, Pat. No. 4,984,388, which is a continuation of Ser. No. 154,645, Feb. 9, 1988, abandoned, which is a division of Ser. No. 878,259, Jun. 25, 1986, Pat. No. 4,724,597.

[51] Int. Cl.$^5$ ............................................. B29C 39/10
[52] U.S. Cl. ................................... 264/278; 264/263; 264/275; 156/99
[58] Field of Search ................. 156/99, 109, 108, 245, 156/313; 264/252, 263, 278, 275; 52/309.16, 656; 49/501, 504, DIG. 2

[56] References Cited

U.S. PATENT DOCUMENTS

| | | | |
|---|---|---|---|
| 1,876,166 | 9/1932 | Randall | 156/245 |
| 3,087,207 | 4/1963 | Styra | 52/309.1 |
| 3,731,443 | 5/1973 | Zaroor | 156/245 |
| 3,787,549 | 1/1974 | Stanley et al. | 264/278 |
| 4,264,389 | 4/1981 | Staub et al. | 156/245 |

Primary Examiner—Michael W. Ball
Assistant Examiner—Francis J. Lorin
Attorney, Agent, or Firm—Kyle W. Rost

[57] ABSTRACT

A prefinished window unit is provided of the type having a sash member with central glazing area, wherein one side of the sash member is designated as the exterior face and the opposite side is designated as the interior face, the central glazing area is bounded by an inner perimetric face, and the sash member is bounded by an outer perimetric face. Each rail of the sash member is formed as a completely prefinished, molded component, requiring no further processing except assembly. The sash members each are integral components having a cellulosic core; an outer coating of synthetic plastic material substantially covering the core from external exposure; and a metal cladding substantially entirely covering the exterior face of the sash member to protect the synthetic coating from ultraviolet degradation. The sash members include slots that receive the glazing strip and weather strip, the slots being defined at least partially by a channel-shaped contour of the metal cladding. In addition, a method of forming molded, prefinished, integral components is disclosed.

5 Claims, 3 Drawing Sheets

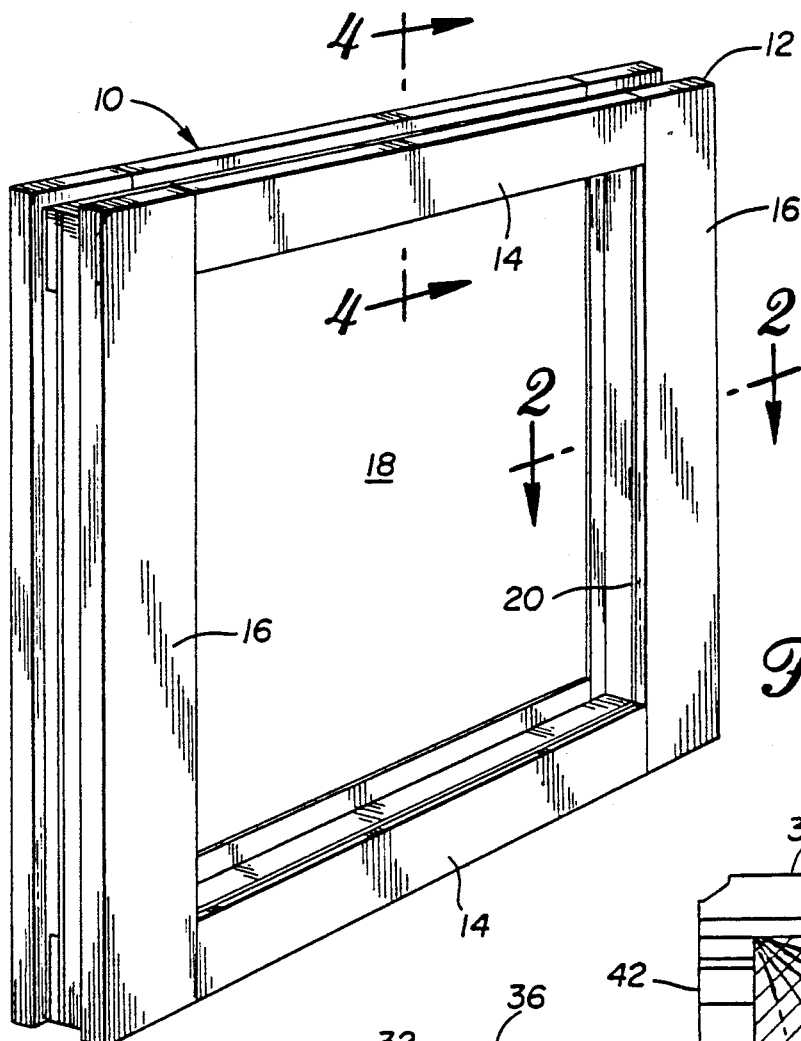
Fig.1
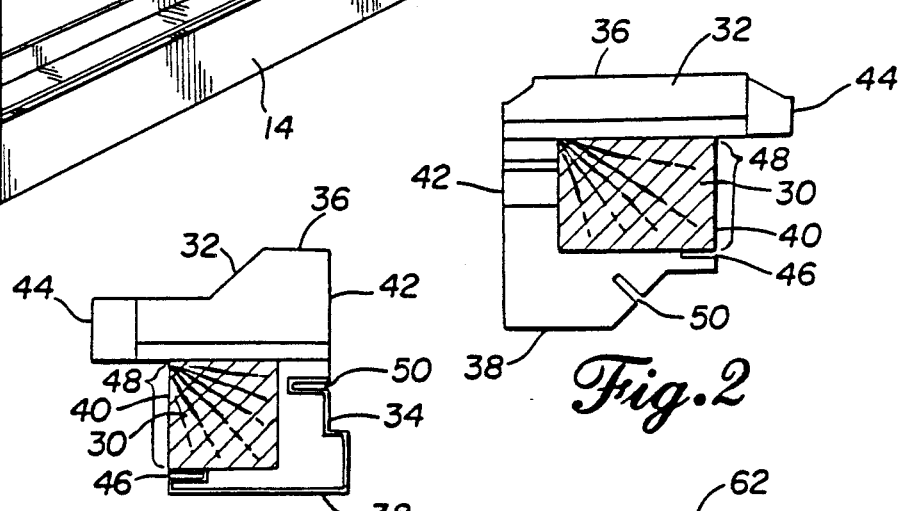
Fig.2
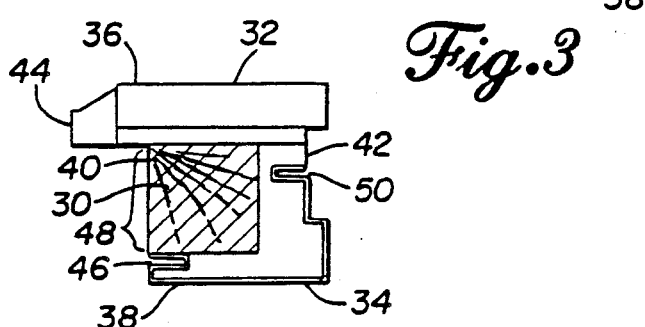
Fig.3
Fig.4
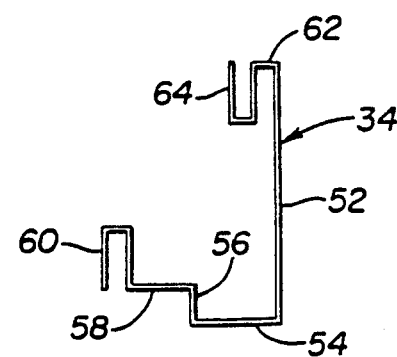
Fig.5

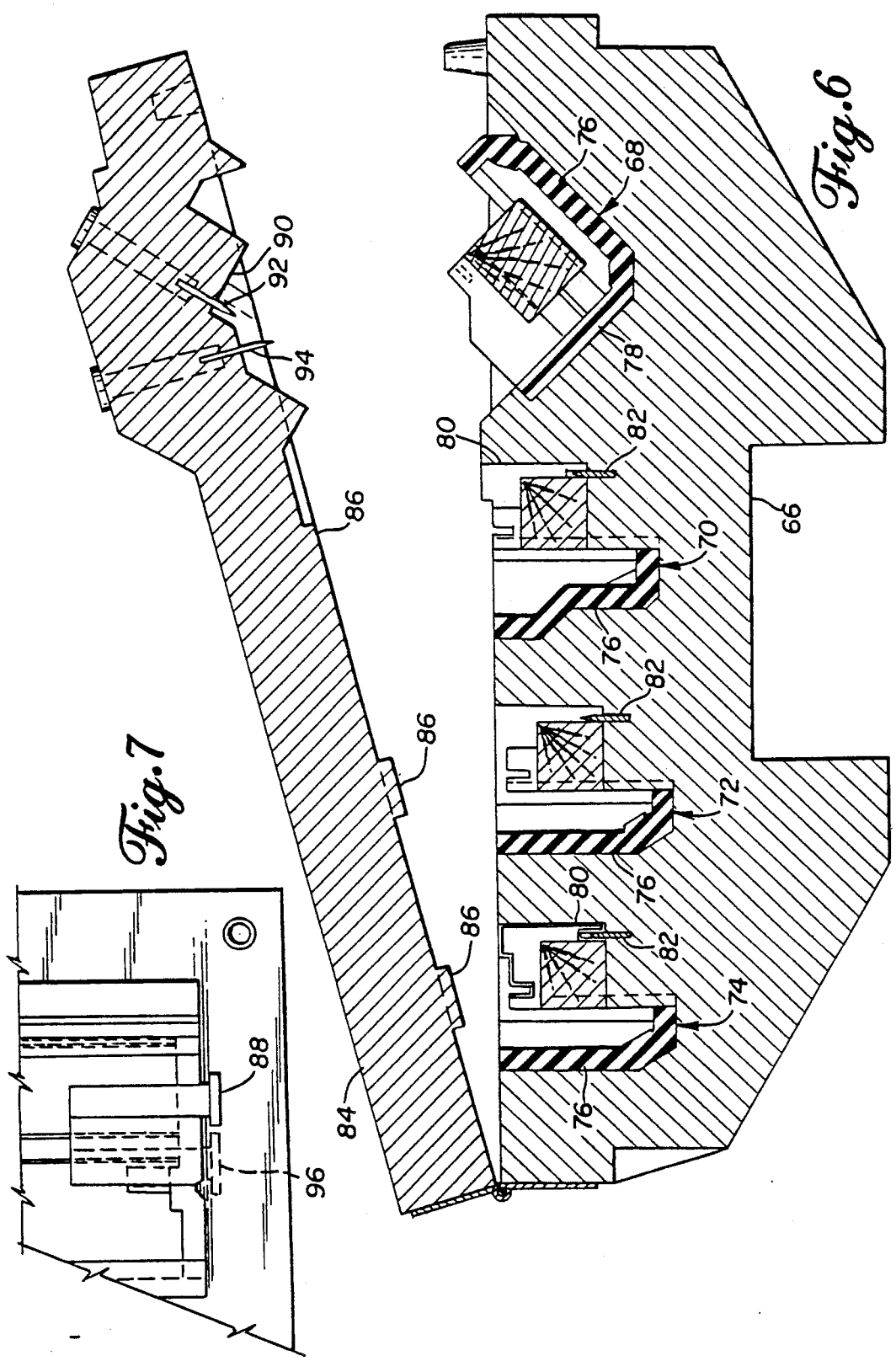

METHOD OF FORMING GLAZED ENCLOSURE

This application is a continuation of application Ser. No. 406,874, filed Sep. 11, 1989, now U.S. Pat. No. 4,984,388 dated Jan. 15, 1991; which is a continuation of application Ser. No. 154,645, filed Feb. 9, 1988, now abandoned; which is a division of application Ser. No. 878,259 filed Jun. 25, 1986, now U.S. Pat. No. 4,724,597 dated Feb. 16, 1988.

BACKGROUND OF THE INVENTION

1. FIELD OF THE INVENTION

The invention generally relates to movable or removable closures, especially to window assemblies. The invention also generally relates to static structures, especially composite fabricated panels. A further aspect of the invention generally relates to stock material, especially that having a structurally defined web or sheet.

2. DESCRIPTION OF THE PRIOR ART

Window units have been constructed from many different materials, often accommodating local climate or cost considerations. For example, many inexpensive windows are constructed with extruded metal frames, which offer simplicity of manufacture and dimensional stability, but often are not thermally efficient or pleasing to the eye. Wooden window frames may offer greater thermal efficiency and beauty, but they can be costly due to greater difficulty of manufacture, and maintenance is often a further problem.

U.S. Pat. No. 4,341,831 to Kleiss discloses an extrusion of multi-material construction. An aluminum or other sheet metal core is sheathed with polyurethane foam. The Kleiss disclosure explains that the prior art has suffered problems in bonding such a sheathing to a metal core, and hence, a new bonding material is proposed to cure the problem. Another patent showing a similar end structure is U.S. Pat. No. 4,130,976 to Kesseler et al., which uses an aluminum core with a bonded polyurethane sheathing.

U.S. Pat. No. 3,815,285 to Kuyper discloses a metal shielding that is designed to snap on to the exterior of wooden window sash as a weather protective device. The advantage gained is in coupling the low maintenance of the metal exterior with the beauty and insulating quality of the wood interior.

While the above noted patents are representative of efforts to improve window construction, they do not fully meet the desire of combined beauty, insulating value, dimensional stability, manufacturing ease, and low maintenance. Particularly in new construction, it is desirable to employ a window unit that is highly efficient in insulating value, both from the standpoint of materials of construction and tightness of construction. Thus, wood or other high insulating material is highly regarded as the material of construction. If the frame and sash can be produced in such a way to ensure that the window unit will maintain its dimensional integrity and structural shape, then the tightness of construction also will be satisfactory.

Additional desirable features of a window unit are that there be little or no maintenance, while, especially in residential applications, the window unit should offer beauty and warmth. Metal extrusions are satisfactory in terms of requiring little care, but metal does not hold an after-applied finish to a satisfactory degree. Wood is superior in terms of beauty and warmth, but maintenance is an on-going requirement. Plastic window constructions are intermediate wood and metal, in that they can hold an applied color or be extruded in a selected color. In addition, plastic offers good insulating value. However, plastic is known to degrade under ultraviolet light, which limits the life of such synthetic materials, especially in an exterior window construction. Further, plastics tend to be more flexible than metal or wood frame and sash and, thus, may lack the strength to hold a structural shape.

A purpose of the present invention is to provide a window unit having the unique combination of a high insulating value similar to that of wood; low maintenance similar to that achieved with metal; a complete surface finish having the pleasing warmth of wood but that requires no painting; and the strength and dimensional stability necessary to ensure continued performance at their original level for many years. In addition, such a window unit should be extremely simple in its method of manufacture so that its cost can be close to that of conventional wood and metal windows.

To achieve the foregoing and other objects and in accordance with the purpose of the present invention, as embodied and broadly described herein, the method of manufacture of this invention may comprise the following.

SUMMARY OF THE INVENTION

Against the described background, it is therefore a general object of the invention to provide an improved window unit having composite construction, wherein the components are formed into an integral unit requiring no further processing or finishing after initial formation.

Another object is to provide a window sash structure that supports the glazing in a stable truss structure, while employing synthetic plastic materials for the external configuration of the sash members.

A further object is to provide a method of producing sash members that embody a composite construction, wherein a single molding process results in a fully finished member.

Still another object is to produce a synthetic plastic finish on a window unit, wherein the finish is fully screened from exposure to ultraviolet light from the exterior of the window.

Additional objects, advantages and novel features of the invention shall be set forth in part in the description that follows, and in part will become apparent to those skilled in the art upon examination of the following or may be learned by the practice of the invention. The object and the advantages of the invention may be realized and attained by means of the instrumentalities and in combinations particularly pointed out in the appended claims.

According to the invention, a window unit is provided of the type having a sash member with central glazing area, wherein one side of the sash member is designated as the exterior face and the opposite side is designated as the interior face, the central glazing area is bounded by in inner perimetric face, and the sash member is bounded by an outer perimetric face. The sash member is formed of a cellulosic core; an outer coating of synthetic plastic material substantially covering the core from external exposure; and a metal cladding substantially entirely covering the exterior face of the sash member to protect the synthetic coating from ultraviolet degradation. The sash member includes slots that receive the glazing strip and weather strip, the slots being defined at least partially by a channel-shaped contour of the metal cladding.

According to another aspect of the invention, a method of forming prefinished sash components includes the steps of providing a mold cavity having the contours of a sash rail having interior and exterior faces and inner and outer perimetric faces with mortise and tenon joint ends, and having a design patterned surface corresponding to the internal face of the rail; coating the design patterned face of the mold with a release agent; placing an elongated core of cellulosic material in the mold, closely adjacent to the mold wall corresponding to the inner perimetric face of the rail; securing the core in position in the mold by placing a metal surface member in the mold in a position closely adjacent to the exterior face, with marginal portions of the metal surface member being closely adjacent to the inner and outer perimetric faces, the marginal portions each including a channel portion that contacts the core, wherein the mold cavity includes rib members that fit into the channel portions and preserve such channel portions as slots in the finished rail; adding a synthetic plastic resin material to the mold cavity; closing the mold; curing the synthetic plastic resin material to form an integral rail having a cellulosic core, metal cladding on the exterior face and exterior marginal portions of the inner and outer perimetric faces, and synthetic plastic coating on the interior face with molded surface design; opening the mold; and removing the sash rail.

The accompanying drawings, which are incorporated in and form a part of the specification illustrate preferred embodiments of the present invention, and together with the description, serve to explain the principles of the invention. In the drawings:

BRIEF DESCRIPTION OF THE DRAWINGS

FIG. 1 is a perspective view of a window unit according to the present invention.

FIG. 2 is a cross-sectional view of a sash inside check rail, taken along the plane of line 2—2 of FIG. 1.

FIG. 3 is a cross-sectional view of a sash outside check rail, similar to the view of FIG. 2.

FIG. 4 is a cross-sectional view of a top or bottom rail or stile, taken along the plane of line 4—4 of FIG. 1.

FIG. 5 is a cross-sectional view of the metal roll form used as a cladding.

FIG. 6 is a side view of a four cavity mold used to form the sash members of FIGS. 2-5, showing in phantom the cavities partially set up for molding.

FIG. 7 is a partial top view of the mold of FIG. 6, showing the movable spacer of the cavity that forms the inside check rail.

DESCRIPTION OF THE PREFERRED EMBODIMENTS

Figure 8:
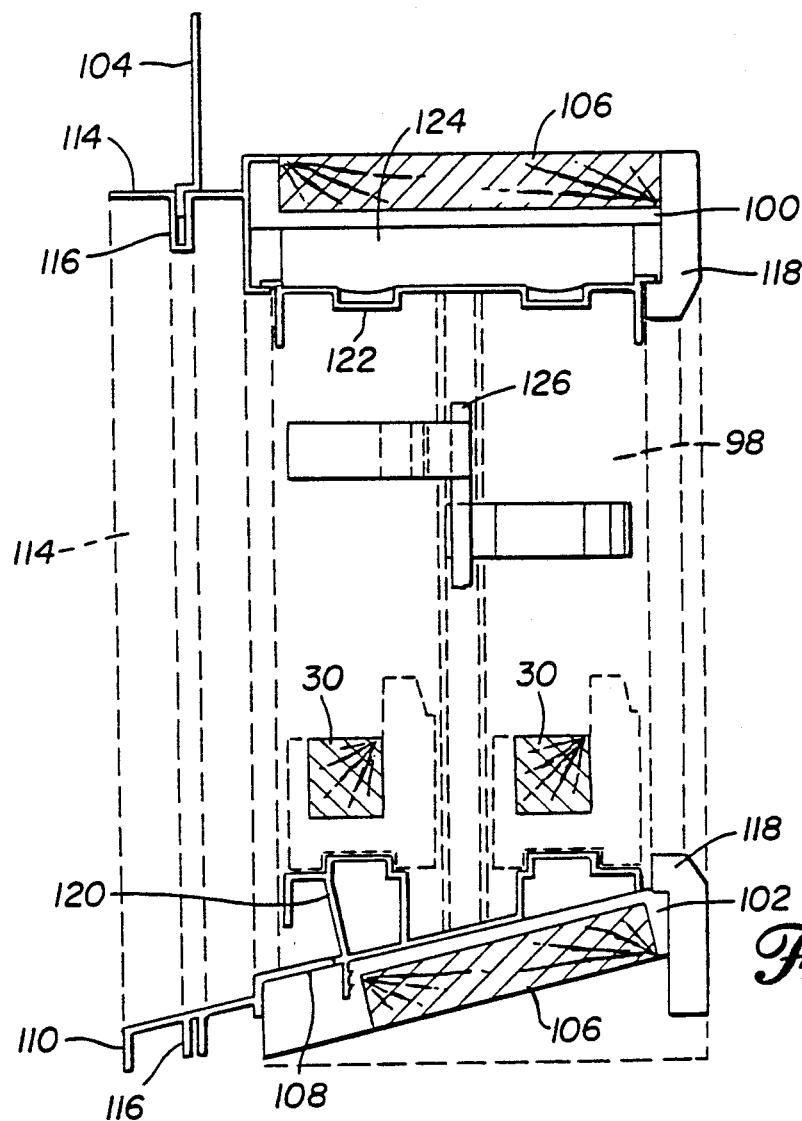
FIG. 8 is a cross-sectional view of the horizontal members of a window frame constructed according to the present invention, with sash members shown in phantom.

According to the best mode of the invention, the window unit 10 as shown in FIG. 1 is constructed from component pieces that correspond in identity to those of a conventionally constructed wood window. The sash 12 is formed from a pair of opposite horizontal members 14, known as top and bottom rails, and a pair of opposite vertical members 16, which together define the rectangular sash. In a horizontal slide-by window, the vertical rail that fits against the jamb of the window frame may be termed a stile, while the vertical rail that fits against the second panel of such a window is termed a check rail, which may be either an inside or outside check rail, depending upon the position of that sash member in the frame. A sheet of glazing material 18 is carried by the sash and may be mounted in glazing strips 20 carried in grooves that follow the inner periphery of the sash. The rails and stiles are joined together by a conventional system of mating tongues. Such window sash 12 is carried in or fastened to a frame, which may include a conventional sill, head jamb, and side jambs formed from components corresponding in identity to those conventionally found in wood windows.

The sash components are of composite construction, wherein each is provided with a core of dimensionally stable cellulosic material and an outer covering of synthetic plastic material. In addition, a metal cladding is integrally formed on the outside face of the sash members, while an integral finish is formed on the inside face of each member. Specifically, with reference to FIGS. 2-4, each sash member is provided with a core 30 of wood-based material such as particle board, which provides a strengthening central structural member that is dimensionally stable. Surrounding the core member at least along its longitudinally elongated sides is a coating 32 of polyurethane having a thickness of as much as one-half inch (1.27 cm). This coating is molded to the core and forms an integral unit with the core. Finally, the metal cladding may be an aluminum roll form 34, roll formed to have a labyrinthian transverse cross-sectional contour. This external cladding also is molded to the polyurethane and further is a part of the integral nature of each sash component.

Several configurations of sash components are utilized in production of a complete window unit, such as double hung window. Each component can be identified as having several similar characteristic parts when viewed in cross-section as in FIGS. 2-4. The rails and stiles each have an interior face 36, an exterior face 38 opposite from the interior face, an internal perimeter face 40, and an external perimeter face 42. These and other similar parts are similarly numbered throughout FIGS. 2-4.

The interior face is relatively designated as the face that will be exposed to the inside of a structure, away from weather and sunlight, whereas the exterior face is directed toward the outside, where weather and sunlight are expected. However, it may be noted that the exterior surface of certain parts such as the sash member of FIG. 2 are not exposed to weather. This sash member, which is an inside check rail, is protected on its outer, exterior surface, by the outside check rail of FIG. 3 when the window is closed. Accordingly, no cladding is necessary on the exterior surface of the inside check rail. The outside check rail and the top and bottom rails and stile of FIG. 4, however, are protected by the cladding.

The internal perimeter will carry the glazing material and, appropriately, is adapted to receive the glazing strip. For example, each internal perimeter includes a retaining ledge or lip 44 near the interior face 36. Spaced relatively closer to the exterior face is a glazing strip retaining slot 46. Between the ledge 44 and slot 46 is the retaining area 48 that receives and supports the glazing and appropriate spacers. Finally, the external perimeter will contact the sill, jambs, and header. Depending upon the precise application of the component, certain external perimeters and exterior faces may define a weather strip retaining slot 50, which receives and supports a sealing strip or brush that reduces drafts between the moveable adjacent sash or between sash and frame members. Specifically, the slot 50 in the top or bottom rails and stile of FIG. 4 is in a recess in face 42, where the weather strip has room to be compressed without holding the sash at a distance from the window frame. Slot 50 in the inside check rail of FIG. 2 is on an angled surface that contacts a similar surface on the outside check rail when the inside and outside sash units are closed within the frame.

The interior face 36 in all cases is formed from polyurethane so that the interior finish is pre-established to a high standard. The polyurethane is molded according to known techniques to embody the texture of wood. Thus, the interior can be modeled after selected excellent specimens of actual wood, producing a uniformity of beauty in each window. The external perimeter 42 also is molded from polyurethane.

The exterior face 38 includes a polyurethane body, but in all cases the portion of the exterior face that will be exposed to direct sun light is clad with a protective material, such as metallic aluminum. Thus, the aluminum roll form 34 is located directly on the surface of the exterior face. As shown in FIG. 5, this roll form includes an outer face 52 that is the immediate outer surface of the exterior face. On the external perimeter face, the roll form follows first an outermost wall portion 54, then an inward offset wall 56, and an inset wall portion 58. Near its terminal edge, the roll form forms a U-shaped groove or channel slot 60 that opens outwardly to simulate the configuration of a saw kerf, as is used in conventional wood windows to hold the weather strip. On the internal perimeter face, the roll form includes an outer wall 62 and a terminal U-shaped channel slot 64, again simulating a saw kerf, but for the purpose of receiving a glazing strip.

The internal perimeter face 40 may have the cellulosic core 30 exposed at the glazing support area 48, although the portions of face 40 at either side of this area, including the ledge 44 and retaining slot 46, are formed of polyurethane. By this construction, the cellulosic core 30 provides a substantial majority, if not all of the surface area in the glazing support area and is placed in direct structural contact with the glazing and its support strips, providing a rigid and durable truss structure to hold the glass in place. Equally as important is that the more complex structure of the retaining slots 46 and ledge 44 be in the area of molded plastic material so that these structures can be formed without the need to process the sash members specially for this purpose, as with a router or saw.

The method of manufacturing the sash members is such that each member is produced in fully finished form and requires no processing or surface finishing before assembly into window units. This method employs a molding process, where a four cavity mold 66 as shown in FIG. 7 can be employed to produce at least one of each of the previously described sash members with each cycle. The cavities 68, 70, and 72 produce sash members corresponding to the sash members of FIGS. 2-4, respectively, and cavity 74 produces a second top or bottom rail or stile member, which is the most frequently used member. Each cavity employs a rubber liner 76 that carries the configuration of an actual wood surface. The liner 76, in each instance, is applied against the surface of the interior face 36 of the respective sash members, with the addition that, in cavity 68, the liner includes an additional portion 78 that is applied against the external perimeter face 42 of the inside check rail of FIG. 2. The inside check rail of a double hung window or horizontal slide-by window has its external perimeter surface is visible, and, thus, such surface is given a decorative finish.

In cavities 70-74, the cross-section of the cavity conforms in detail to that of the desired product except for the presence of slots 46 and 50. The internal perimeter face 40 is located at the bottom of each of these cavities, permitting the cavities to be loaded initially with the cellulosic core piece 30. These core pieces 30 are held in place not only by gravity, but also by locator means such as portions of the roll form 34, as will be described below. Next, the aluminum roll form 34 is placed in the cavity with outer face 52 against the cavity side wall 80 opposite from the liner 76. A rib 82 at the bottom face of each cavity extends upwardly to be engaged in slot 64 of the roll form, thereby holding the roll form in fixed position and preventing entry of polyurethane into these slots during molding. The mold lid 84 includes keying protrusions 86 that engage the offset wall 56 of the roll form 34 when the mold is closed to assure that the roll form remains in the proper position. The protrusions 86 also seal against the open faces of slots 60, thereby preventing entry of polyurethane into these slots during molding.

The aluminum roll form 34 serves as a locator means to hold the core 30 in the desired position within the mold cavity. The slots 60 and 64 become stops to properly position the core 30. The slot side wall of slot 64 limits lateral travel of the core, while the slot bottom wall of slot 60 limits vertical travel of the core. When the core and the roll form have been loaded into the mold, both have a stable position by virtue of their interaction.

The sash member of FIG. 2 is molded in a diagonal position, wherein the interior face 36 and external perimeter face 42 are molded against the bottom two surfaces of the mold. Thus, the mold base 66 contains the molding surface for faces 36 and 42, while the mold lid defines the surfaces to form faces 38 and 40. Accordingly, cavity 68 receives the core 30 in a suspended position, with the glazing area being a diagonal top surface. A retractable spacer 88 in the side of the mold assist holding the core in its proper place during assembly, and a registering surface 90 of the lid 84 is applied against the core during the molding process to ensure that the core is properly located. In addition, the slots 46 and 50 must be formed by moveable, retractable ribs 92 and 94, respectively, carried by the lid 84. These ribs are retracted after the molding process, as they otherwise would be cause lid 84 to be molded in place after the molding process was complete.

The spacer 88, best shown in FIG. 7, slides into cavity 68 perpendicularly to what will be glazing support surface 48 in the finished mold product. The spacer establishes a slot in the end of the finished product, permitting a mortise and tenon joint to be used when the finished product is assembled with remaining sash members. The mold includes a slot 96 to receive the T-head of the spacer, and the depth of the slot 96 limits the travel of the spacer into the mold.

The molding process requires, first, that the mold cavities and blankets 76 be treated with a release agent such as a barrier coat material that assists in releasing the urethane from the RTV silicone of the cavity, and which also provides pigment and ultraviolet protection to the wood grained portion of the molded sash pieces. The cores 30 and roll forms 34 then are loaded into the corresponding cavities. Polyurethane resin is poured to fill the remaining open areas, after which the mold is closed. The ribs 92 and 94 are extended to enter the channels of the roll forms, after which the resin is cured. Ribs 92 and 94 are retracted from cavity 68, after which the mold is opened. Spacer 88 is withdrawn, and the sash pieces are removed.

The pieces so removed are in finished form and can be assembled into a rectangular sash as shown in FIG. 1, generally by mortise and tenon joints. Weather strip is inserted in roll form slots 50 formed by channels 60. The glazing, spacers, and glazing strip are then put in place, with the glazing strip being placed in slot 46, formed by channel 64.

It is notable that the finished product has no synthetic plastic surface on the exterior face directly exposed to sunlight. The aluminum roll form clads all externally exposed surfaces. The glazing strip covers and protects the glazing area from the roll form to the ledge 44. Finally, the glazing material serves as an ultraviolet light filter to protect the wood grained polyurethane from the ledge to the interior face of the window unit.

Figure 9:
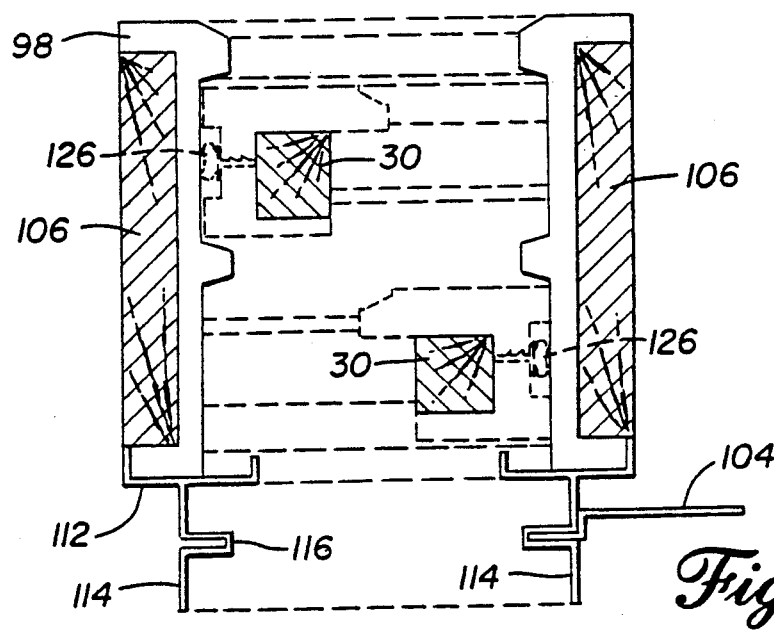
FIG. 9 is a cross-sectional view of the vertical members of a window frame constructed according to the present invention, with sash members shown in phantom.

The sash has been described completely, and the frame surrounding the sash is formed along similar lines. With reference to FIGS. 8 and 9, a typical frame and sash panel combination is shown for horizontal side-by windows. The frame is formed of side jambs 98, a head jamb 100, and a sill 102. These are covered with an extruded aluminum cladding and carry an aluminum nailing flange 104 to permit attachment of the window to the frame of a building structure. The jambs and sill of the frame are molded of polyurethane having a cellulosic core 106, similar to core 30 of the sash members.

Metal extrusions cover the parts of the frame that are exposed to weather. The sill 102 is not only covered by a cladding 108, but is contoured into an outwardly extending sill portion 110 formed entirely from aluminum. The head jamb 100 and side jambs 98 include cladding 112 having outward extensions 114 of extruded aluminum. The outward extensions 110 and 114 are contoured to form a slot 116 that receives the nailing flange 104.

The frame further includes both decorative and functional components that enhance the appearance and operation of the window unit. Interior trim pieces 118, FIG. 8, are of molded polyurethane, having a wood-finish surface appearance. The sill track 120 and head track 122 are of extruded PVC for lubricity. A flexible open cell urethane compression member 124 is located between the head track and head jamb. As is best shown in FIG. 8, the horizontal sash members, such as bottom rails for the inside and outside sash panels, slide on the sill track.

The assembled sash panels are tightly sealed against air penetration. The vertical sash members, such as inside and outside check rails, are sealed between themselves by bulb weatherstrip 126, shown in FIG. 8. The vertical stiles seal against the side jambs with similar weatherstrip, as shown in FIG. 9, thus sealing the sash to the frame. The frame thus disclosed further lends itself to use with conventional screens, which may be placed between the slot channel 116 and the surface cladding on the jambs.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be regarded as falling within the scope of the invention as defined by the claims that follow.

The embodiments of the invention in which an exclusive property or privilege is claimed are defined as follows:

1. A method of forming prefinished frame components of a glazed enclosure, comprising:
   providing a mold defining a mold cavity having the contours of a frame component having an interior and an exterior face, an inner and an outer perimetric face, said mold cavity having a design patterned surface corresponding to the internal face of the frame component;
   coating said design patterned surface of the mold cavity with a release agent;
   placing an elongated core of cellulosic material in the mold cavity;
   placing a locator means closely adjacent to the core in the mold cavity for securing the core in position in the mold cavity, wherein said locator means comprises a metal surface member placed in a position closely adjacent to said mold cavity wall corresponding to the exterior face of the frame component, with marginal portions of the metal surface member being closely adjacent to said mold cavity walls corresponding to the inner and outer perimetric faces of the frame component;
   adding a synthetic plastic material to the mold cavity;
   closing the mold;
   curing the synthetic plastic material to form an integral frame member having a cellulosic core, metal cladding on an exterior face and exterior marginal portions of an inner and outer perimetric face, and synthetic plastic coating on an interior face with molded surface design;
   opening the mold; and
   removing the frame component.

2. The method of claim 1, wherein said core is placed in the mold in a position resting on the surface corresponding to the inner perimetric face, such that the core is exposed on the inner perimetric face of the molded frame component.

3. The method of claim 1, wherein said mold cavity defines the contours of a frame component having mortise and tenon joint ends and includes an insertable and removable spacer means defining a mortise gap in said mold cavity end corresponding to a joint end of the frame component, the method further comprising:
   prior to the step of closing the mold, inserting the spacer means into the cavity; and
   before the step of removing the frame component, removing the spacer means.

4. The method of claim 1, wherein:
   said marginal portions of the metal surface member each comprise a channel portion; and
   said mold cavity comprises rib members that fit into said channel portions and preserve such channel portions as slots in the finished frame member.

5. The method of claim 4, wherein said rib members are carried in the mold on extendable and retractable mountings, the method further comprising:

immediately after the step of closing the mold, extending the rib members into said channel portions of the metal surface member; and immediately before the step of opening the mold, retracting the rib members from the channel portions.

* * * * *